United States Patent [19]

Cappelletti

[11] Patent Number: 5,497,345
[45] Date of Patent: Mar. 5, 1996

[54] NONVOLATILE EPROM, EEPROM OF FLASH-EEPROM MEMORY WITH TUNNEL OXIDE PROTECTION

[75] Inventor: Paolo G. Cappelletti, Seveso, Italy

[73] Assignee: SGS-Thomson Microelpctonics S.r.l., Agrate Brianza, Italy

[21] Appl. No.: 196,572

[22] Filed: Feb. 15, 1994

[30] Foreign Application Priority Data

Feb. 17, 1993 [EP] European Pat. Off. ............. 93830058

[51] Int. Cl.$^6$ ............................................. G11C 11/34
[52] U.S. Cl. ............. 365/185.28; 365/105; 365/175; 365/185.33; 257/551; 257/603
[58] Field of Search ..................... 365/185, 900, 365/105, 175; 257/314, 315, 316, 317, 104, 105, 106, 551, 603

[56] References Cited

U.S. PATENT DOCUMENTS

| | | | |
|---|---|---|---|
| 4,247,918 | 1/1981 | Iwahashi et al. . | |
| 4,928,157 | 5/1990 | Matsunaga et al. . | |
| 5,103,425 | 4/1992 | Kuo et al. | 257/603 X |
| 5,295,095 | 3/1994 | Josephson | 365/185 |
| 5,304,802 | 4/1994 | Kumagai | 257/603 X |

FOREIGN PATENT DOCUMENTS 0126184  11/1984  European Pat. Off. .

2118797  11/1983  United Kingdom .

OTHER PUBLICATIONS

Patent Abstracts of Japan, vol. 16, No. 50 (P–1308) 7 Feb. 1992, JP–A–3250494 (Ricoh Co. Ltd.), 8 Nov. 1991.

Primary Examiner—David C. Nelms
Assistant Examiner—Huan Hoang
Attorney, Agent, or Firm—David M. Driscoll; James H. Morris; Brett Dorny

[57] ABSTRACT

To protect the thin tunnel oxide layer interposed between the floating gate region of memory cells and the substrate and which are subject to in-process damage, when the wafer is subjected to radiation, provision is made for a diode, connected between the control gate region of the cells and the substrate. The diode defines a conductive path that, when normal operating voltage is applied to the control gate regions, is turned off and has no effect on normal operation of the memory, and which is turned on to permit the passage of charges between the control gate region and the substrate, when the control gate potential exceeds normal operating potential but is less than the breakdown voltage of the tunnel oxide divided by the coupling factor of the control and floating gate regions of the cells. The diode is appropriately formed prior to patterning the control gate regions of the cells.

12 Claims, 3 Drawing Sheets

NONVOLATILE EPROM, EEPROM OF FLASH-EEPROM MEMORY WITH TUNNEL OXIDE PROTECTION

BACKGROUND OF THE INVENTION

1. Field of the Invention

The present invention relates to a nonvolatile EPROM, EEPROM or FLASH-EEPROM memory with tunnel oxide protection.

Though applicable to all the above types of memory, the present invention is particularly advantageous in the case of flash-EEPROM memories to which special reference is made in the following description.

2. Discussion of the Related Art

Flash-EEPROM memories are Electrically Erasable Programmable Read Only Memories (EEPROMS), which combine the high density and low cost of EPROMs with the advantage of electrical erasability. They have recently become the most attractive of nonvolatile memories for their potential application in solid state disks for portable computers.

Though various flash memory concepts have been developed, most flash memories employ a very thin (8–12 nm) oxide layer through which each memory cell may be programmed and erased by Fowler-Nordheim tunneling, and which is therefore known as the "tunnel oxide."

The following description deals with the most commonly used flash-EEPROM cell structure, the double-Poly single-transistor cell, though the present invention applies to any cell structure employing tunnel oxide.

Double-poly single-transistor flash cells present a structure closely resembling that of standard EPROM cells, and comprise an NMOS transistor with a, polysilicon floating gate region capacitively coupled to a second polysilicon layer defining a control gate. The main difference between these two types of cell lies in the thickness of the oxide between the floating gate region and the substrate, which is much thinner in the case of flash cells.

For the sake of clarity, a description will now be given of a flash-EEPROM cell with reference to the cross section shown in FIG. 1.

Number 1 in FIG. 1 indicates a flash-EEPROM cell formed, in this case, in a P type substrate 2 housing N+ type source and drain regions 3 and 4 separated by a channel region 5 formed by the substrate itself. Over substrate 2, aligned with channel 5, there are provided a floating gate region 6, fully embedded in an oxide layer 8, and a control gate region 7. Floating gate region 6 is separated from the substrate by a thin oxide layer 8a; control gate region 7 is separated from floating gate region 6 by a oxide portion 8b and source region 3 presents a graded junction with the substrate, that is, is formed in two parts: a heavily doped (N+) part 3a facing the larger surface 10 of the substrate; and a deeper, lightly doped (N−) part 3b surrounding part 3a on the sides not facing surface 10.

The yield and reliability of flash memories are known to be closely related to the quality of the tunnel oxide, which not only depends on preoxidation cleaning and the oxidation process itself, but is also strongly affected by the post-oxidation process steps.

Of all the process steps, the most critical are those which expose the wafer to radiation damage, namely ion implantation, plasma etching, sputtering and plasma enhanced chemical vapor deposition.

Currently used flash-EEPROM memory processes present a large number of such steps following growth of the tunnel oxide.

The model generally accepted for explaining in-process radiation is the so-called "antenna effect" in which charges are trapped in conductive layers and may result in a critical increase in the potential of the layers.

To explain the phenomenon, it should be borne in mind that ion implantation and plasma processes involve the collision of charge particles (either electrons or ions) with the wafer surface, so that conductive polysilicon layers insulated from the silicon substrate may be charged by capturing the charge particles.

If the polysilicon layer is not patterned, it acts as an electrostatic shield. In fact, the charge is distributed evenly over the entire area of the wafer, thus generating a low electric field. This is also because, in the case of ion implantation, the beam is localized and the overall charge density is low. In addition, the metal grips holding the wafer may act as discharge lines f or at least partly removing the captured charge particles, so that little danger exists for the dielectric layer underlying the polysilicon.

If, on the other hand, the layer is patterned and comprises "islands", i.e., areas insulated conductively from the rest of the layer and separated from the substrate by a thin oxide layer, as in the case of gate regions, the layer is charged to a potential that depends on the collecting area and its capacity versus the substrate, i.e., the area of the thin oxide. If the ratio between the collecting area and the area of the thin oxide is unfavorable (high), the gate region may easily reach a potential higher than the breakdown voltage of the thin oxide, thus resulting in oxide breakdown—in turn, resulting in "zero time" device failure, i.e., before it is even used—or in oxide damage with the formation of traps in the oxide itself and which, in turn, results in "latent" device failure and impaired reliability.

The above model also applies to flash cells. In fact, in certain situations, the tunnel oxide may be damaged due to capacitive coupling of the control and floating gate regions, and the lower dielectric resistance of the tunnel oxide in relation to the dielectric layer separating the control and floating gates. The likelihood of this occurring is even greater, in view of the extensive collecting area defined by the polysilicon strips forming the control gates, and the small area of the tunnel oxide of each cell. Consequently, the tunnel oxide may be broken or damaged in the event the control gate region is charged to a potential greater than the breakdown voltage of the tunnel oxide divided by the coupling factor of the control gate.

At present, the only way of minimizing-the "antenna effect," as described above, is to modify the process by exposing the wafer, in the case of high-current implantation, to an electron "shower" to compensate for the positive charge produced by the ion beam, or by optimizing the plasma etching process to reduce radiation damage. Such solutions, however, complicate the process and are difficult to control.

It is an object of the present invention to prevent post-oxidation, in-process radiation damage of the tunnel oxide, while at the same time eliminating the disadvantages of known solutions.

SUMMARY OF THE INVENTION

According to the present invention, there is provided a nonvolatile EPROM, EEPROM or FLASH-EEPROM memory with tunnel oxide protection.

The present invention also relates to a method of fabricating a nonvolatile EPROM, EEPROM or FLASH-EEPROM memory with tunnel oxide protection.

According to the invention, a nonvolatile memory with tunnel oxide protection, and a method for making the same, is provided. The nonvolatile memory includes a number of memory cells, each having control gate regions capable of reaching an operating potential, floating gate regions, and tunnel oxide layers separating the floating gate regions from a substrate. The tunnel oxide layers each have a breakdown potential, and the control gate and floating gate regions are characterized by a coupling factor. The memory further includes selectively-opened conductive paths interposed between the control gate regions and the substrate. The conductive paths are open when the control gate regions are brought to the operating potential so as to prevent passage of electric charges, and they are closed so as to allow the passage of electric charge between the control gate regions and the substrate, when the control gate regions reach potentials higher than the operating potential and lower than the breakdown potential divided by the coupling factor.

The method of forming the same includes the following steps: having a thin tunnel oxide layer of semiconductor material so as form floating gate regions; depositing a layer of dielectric material; and depositing and patterning a second layer of semiconductor material so as to form control gate regions. Conductive paths are formed prior to the step of patterning the second layer of semiconductor material.

BRIEF DESCRIPTION OF THE DRAWING

A preferred, non-limiting embodiment of the present invention will be described by way of example with reference to the accompanying drawings, in which.

DETAILED DESCRIPTION

Figure 1:
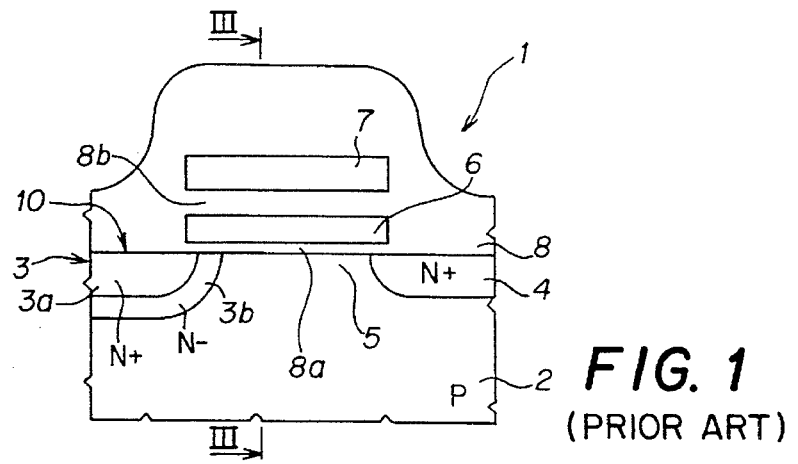
FIG. 1 shows a cross section of a known flash-EEPROM memory cell.
Figure 2:
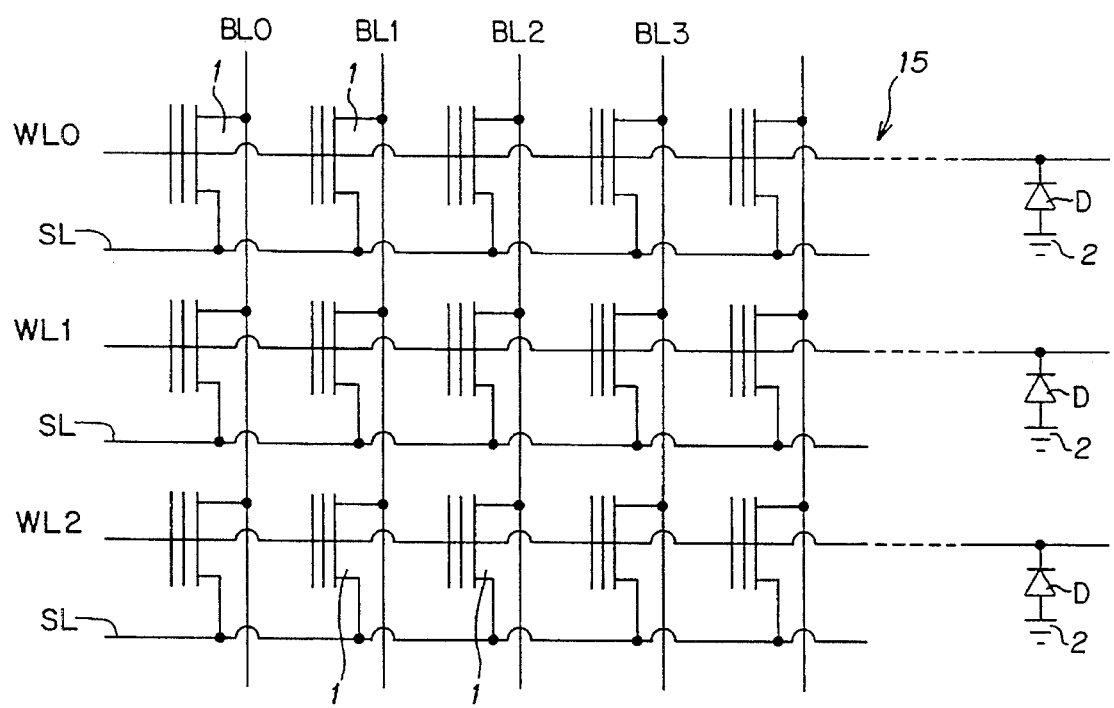
FIG. 2 shows an equivalent electric diagram of a flash-EEPROM memory array in accordance with the present invention.

Number 15 in FIG. 2 indicates a flash-EEPROM memory array comprising a number of cells 1, each having the structure shown in the FIG. 1 section. In a manner known in the art, cells I are arranged in lines and columns, and present control gate regions connected to word lines WL0–WL2 defining the lines of the array; drain regions connected to bit lines BL0–BL3 defining the columns of the array; and source regions connected to source lines SL (parallel to the word lines).

According to the present invention, a diode D is inserted between the gate region of cells 1 and substrate 2, for discharging any charges which would otherwise result in a dangerous increase in the potential of the control gate region.

In particular, with regard to FIG. 2, each word line WL0, WL1, ... is connected to the cathode of a diode D, the anode of which is connected to substrate 2, shown by the ground symbol in the diagram.

Figure 3:
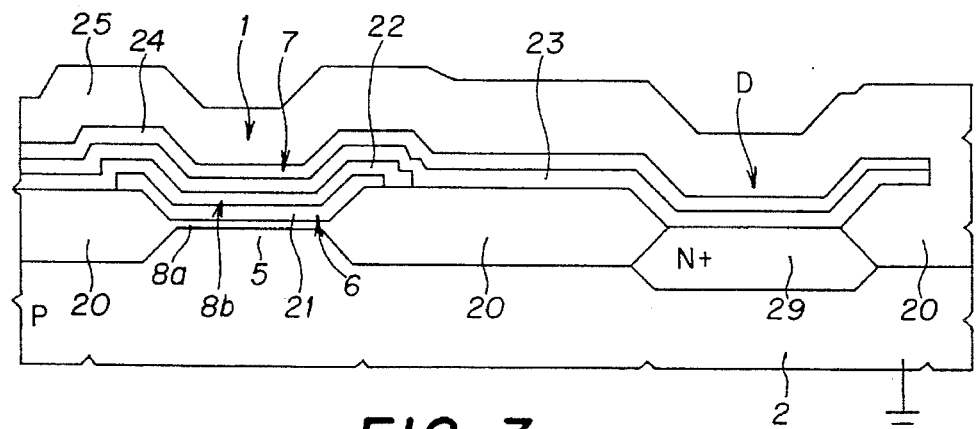
FIG. 3 shows a cross section along line III—III in FIG. 1 of the memory according to the present invention.

Diodes D may be implemented as shown in the FIG. 3 cross section (perpendicular to the FIG. 1 section), in which, for the sake of simplicity, the same numbering system is used as in FIGS. 1 and 2.

FIG. 3 is a cross section of the last cell 1 of one of the lines of array 15, next to respective line diode D, and shows P type substrate 2; channel region 5, defined by two thick field oxide portions 20, one of which separates cell I from diode D; thin tunnel oxide layer 8a; a polycrystalline silicon layer 21, defining floating gate region 6; a layer 22 of dielectric material, defining oxide portion 8b; a polycrystalline silicon layer 23 and silicide (WS1 2 ) layer 24 defining the control gate region 7 of cell I and a word line WL; and a thick oxide layer 25, defining, together with dielectric layer 22, the outer portion of oxide 8 in FIG. 1.

As shown in FIG. 3, substrate 2 also houses an N+ type region 29, surrounded by field oxide regions 20 and facing substrate surface 10 (see FIG. 1), where it electrically contacts polysilicon and silicide layers 23 and 24, defining the word line. To connect region 29 electrically to control gate regions 7 of the cells on the same line, layers 23 and 24 are extended further as compared with known memories. N+ type region 29 forms a PN junction with substrate 2, and so defines the cathode of diode D, the anode of which is defined by the substrate.

In the fabrication process, diodes D must be formed before patterning the control gate region using the respective gate mask, and the process parameters must be so selected that the breakdown voltage of diodes D is properly tuned to the operating conditions of the cells, so as to be effective when required, but without interfering with normal operation of the memory array. More specifically, the breakdown voltage of the diodes must be higher than the maximum voltage applied to the control gate during programming, and less than the breakdown voltage of the tunnel oxide divided by the coupling factor of the control gate.

Figure 4:
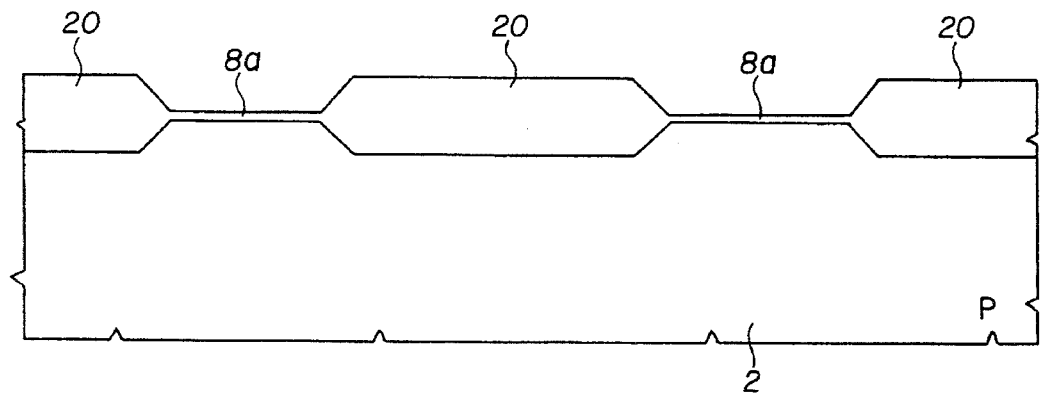
FIGS. 4–9 show cross sections as in FIG. 3 at various steps in the fabrication of the memory.
Figure 5:
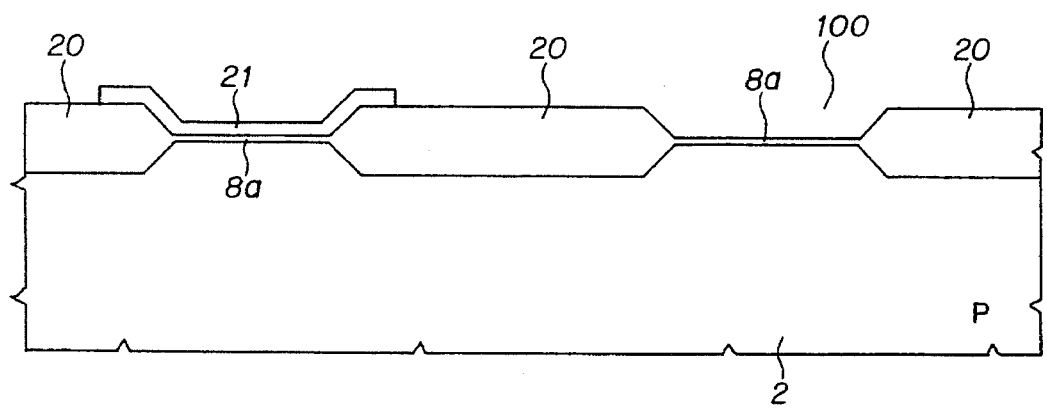
Figure 6:
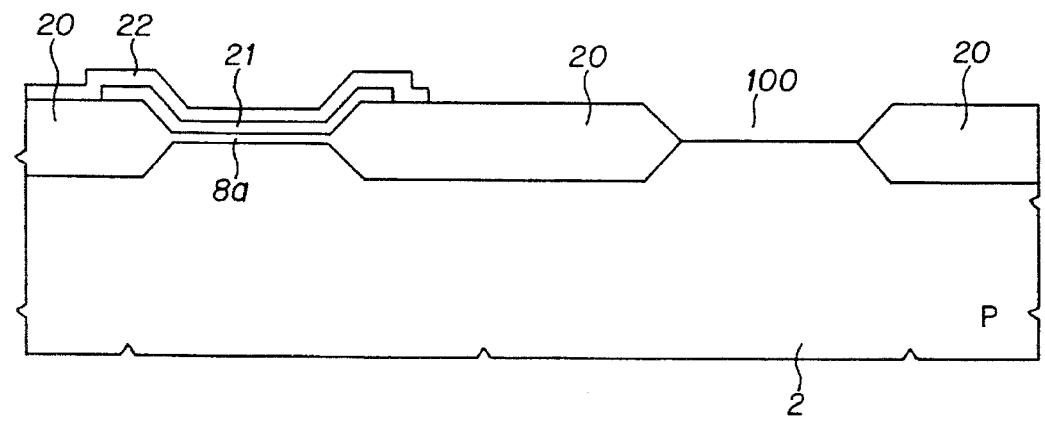
Figure 7:
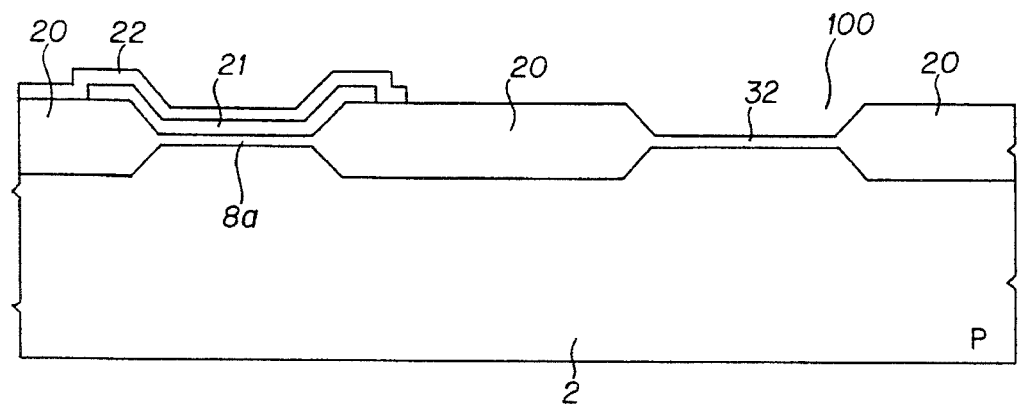

By way of example, FIGS. 4–9 show a number of process steps for forming memory array 15 including protection diodes D. The process presents the same steps as in the standard process up to growth of the tunnel oxide of the memory cells, as shown in FIG. 4, which shows P type substrate 2, field oxide regions 20 and tunnel oxide 8a. The active area mask must of course be modified slightly to provide for the active areas of diodes D. At this point, the first polysilicon layer 21 is deposited and, as in known processes, is then patterned. In this case in particular, layer 21 is also removed from the active area 100 in which diode D is to be formed, to give the structure shown in FIG. 5. Dielectric layer 22 is then deposited and patterned so as to also remove it from the diode area. In this step, thin oxide layer 8a over the active area of the diode is etched and removed, as shown in FIG. 6.

Figure 8:
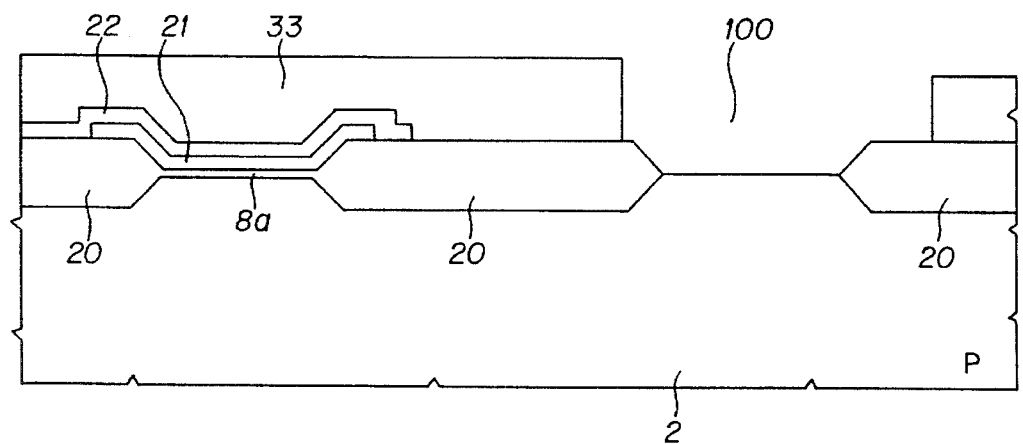

This is followed by gate oxidation of the peripheral transistors (not shown) of the control circuits of the memory array, causing the formation, on the active region of the diode 100, of an oxide layer 32 (FIG. 7) which is then removed using a mask 33, covering the whole of the memory array and the circuit transistors (FIG. 8).

Figure 9:
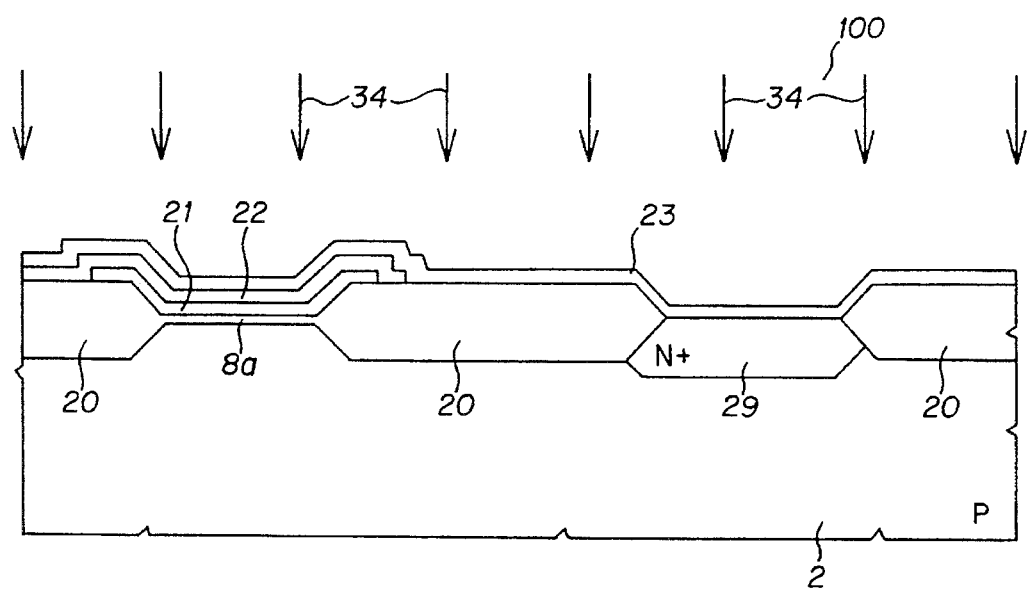

The second polysilicon layer 23 is then deposited and doped in the usual manner, as shown by arrows 34, and the doping species employed also penetrate inside substrate 2 at the active areas 100 of the diodes to produce regions 29 (FIG. 9). At this point, diodes D are complete, and begin operating so as to remove any excess charges from polysilicon layer 23. The rest of the process comprises the usual steps (not shown) of depositing silicide layer 24 (FIG. 3), patterning the gate regions of the circuit transistors and the cells, forming the drain and source regions, and forming the protective layers and connections.

The diodes therefore provide for preventing the control gate region of each cell from reaching a potential which may damage the tunnel oxide. Before such a potential is reached, in fact, the diodes become conductive and discharge any excess charges, which may result in an increase in potential in relation to the substrate, thus ensuring a safe maximum potential of the control gate regions. By virtue of the diodes being formed prior to patterning the polysilicon layer forming the control gate regions together with the silicide layer, the diodes are effective prior to performing the process that may result in an increase in potential of the polysilicon layer.

The solution according to the present invention thus provides for solving the problem of damage or even breakage of the thin tunnel oxide in an extremely straightforward manner.

Moreover, the increase in the area of the memory as a whole, due to provision of diodes D, is negligible, by virtue of one diode being sufficient for all the cells connected to the same word line.

As regards the fabrication process, the diodes may be formed using only one additional mask, if the process does not allow for buried contacts; and, as already stated, the diodes may be fabricated simultaneously with the memory array using well known, highly controllable process steps.

To those skilled in the art it will be clear that changes may be made to the memory as described and illustrated herein without, however, departing from the scope of the present invention. In particular, the solution described may, as stated, also be applied to other types of memory cell providing they present a thin tunnel oxide layer.

Having thus described one particular embodiment of the invention, various alterations, modifications, and improvements will readily occur to those skilled in the art. Such alterations, modifications, and improvements are intended to be within the spirit and scope of the invention. Accordingly, the foregoing description is by way of example only and is limited only as defined in the following claims and the equivalents thereto.

What is claimed:

1. A nonvolatile memory comprising a number of memory cells having control gate regions capable of reaching an operating potential, floating gate regions, and tunnel oxide layers separating said floating gate regions from a substrate of semiconductor material; said tunnel oxide layers having a breakdown potential; and said control gate and floating gate regions presenting a coupling factor; said memory further comprising selectively-opened conductive paths interposed between said control gate regions and the substrate; said conductive paths being open for arresting a passage of electric charges when said control gate regions are brought to said operating potential, and being closed for permitting the passage of electric charges from said control gate regions to the substrate through the selectively opened conductive paths upon said control gate regions reaching potentials higher than said operating potential and lower than said breakdown potential divided by said coupling factor.

2. The memory as claimed in claim 1, wherein said conductive paths comprise diodes interposed between said control gate regions and ground.

3. The memory as claimed in claim 2, wherein said cells are arranged in lines and columns, and wherein the control gate regions of the cells on the same line are mutually connected by a line of semiconductor material; and wherein one diode is used for the line of semiconductor material.

4. The memory as claimed in claim 3, wherein said lines of semiconductor material are formed by depositing a layer of semiconductor material via a patterning step; and wherein said diodes are formed prior to said patterning step.

5. The memory as claimed in claim 3, wherein said substrate is of a P type; and wherein said substrate defines the anode region of said diodes, and said substrate houses N type regions defining the cathode regions of said diodes; said N type regions facing a larger surface of said substrate and said N type regions being electrically connected to said control gate regions.

6. The memory as claimed in claim 5, wherein each said line of semiconductor material is in direct electrical contact with a corresponding N type region.

7. An intermediate structure for forming a memory with tunnel oxide protection, comprising:
   a substrate of semiconductor material;
   thick oxide regions delimiting active areas of said memory;
   thin oxide portions overlying said active areas of the memory;
   regions of semiconductor material overlying said thin oxide portions;
   portions of dielectric material overlying said regions of semiconductor material; and
   an unpatterned layer of semiconductor material covering at least the portions of dielectric material;
   wherein the structure further comprises conductive paths connecting said unpatterned layer to said substrate.

8. The intermediate structure of claim 7, wherein the conductive paths include diodes.

9. The intermediate structure of claim 8, wherein the regions of semiconductor material have a breakdown voltage such that the thin oxide portions will breakdown if a voltage of the regions of semiconductor material exceed the breakdown voltage, and wherein the diodes are structured and arranged so that the diodes conduct when the voltage of the regions of semiconductor material reaches the breakdown voltage.

10. A nonvolatile memory, comprising:
    at least one memory cell, having;
    a substrate of semiconductor material;
    a control gate region on said substrate capable of reaching an operating potential;
    a floating gate region on said substrate;
    a tunnel oxide layer separating said floating gate region from said substrate;
    wherein said tunnel oxide layer will be damaged if the floating gate region reaches a breakdown voltage; and
    means for preventing the floating gate region from reaching the breakdown voltage.

11. The nonvolatile memory of claim 10, wherein the means for preventing includes means for preventing the floating gate region from reaching a breakdown voltage during fabrication of the nonvolatile memory.

12. The nonvolatile memory of claim 10, wherein the means for preventing includes at least one diode arranged to operate in a reverse breakdown mode from said control gate region to ground.

* * * * *

UNITED STATES PATENT AND TRADEMARK OFFICE

CERTIFICATE OF CORRECTION

PATENT NO. : 5,497,345
DATED : March 5, 1996
INVENTOR(S): Paolo G. Cappelletti

It is certified that error appears in the above-identified patent and that said Letters Patent is hereby corrected as shown below:

Title page, item [54] and column 1, lines 1-3, should read as follows:

[54] NONVOLATILE EPROM, EEPROM OR FLASH-EEPROM MEMORY WITH TUNNEL OXIDE PROTECTION

[73] Assignee: SGS-Thomson Microelectronics S.r.l.
Agrate Brianza, Italy

Signed and Sealed this

Third Day of September, 1996

Attest:

BRUCE LEHMAN

*Attesting Officer*  *Commissioner of Patents and Trademarks*